United States Patent
Harkema et al.

(10) Patent No.: US 11,921,955 B2
(45) Date of Patent: Mar. 5, 2024

(54) PROXIMITY SENSITIVE DISPLAY ELEMENT

(71) Applicant: Nederlandse Organisatie voor toegepast-natuurwetenschappelijk onderzoek TNO, 's-Gravenhage (NL)

(72) Inventors: Stephan Harkema, Hilversum (NL); Jeroen Franciscus Marinus Schram, Waalre (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 107 days.

(21) Appl. No.: 17/274,924

(22) PCT Filed: Sep. 16, 2019

(86) PCT No.: PCT/NL2019/050602
§ 371 (c)(1),
(2) Date: Mar. 10, 2021

(87) PCT Pub. No.: WO2020/055259
PCT Pub. Date: Mar. 19, 2020

(65) Prior Publication Data
US 2022/0057891 A1  Feb. 24, 2022

(30) Foreign Application Priority Data
Sep. 14, 2018 (EP) .................................. 18194580

(51) Int. Cl.
*G06F 3/042* (2006.01)
*H01L 25/075* (2006.01)

(52) U.S. Cl.
CPC .. *G06F 3/0421* (2013.01); *G06F 2203/04108* (2013.01); *H01L 25/0753* (2013.01)

(58) Field of Classification Search
None
See application file for complete search history.

(56) References Cited

U.S. PATENT DOCUMENTS

| 2010/0177060 A1* | 7/2010 | Han | G06F 3/0443 345/174 |
|---|---|---|---|
| 2013/0127721 A1 | 5/2013 | Gu et al. | |

(Continued)

FOREIGN PATENT DOCUMENTS

| CN | 102144199 A | 8/2011 |
|---|---|---|
| CN | 102209949 A | 10/2011 |

(Continued)

OTHER PUBLICATIONS

European Patent Office, International Search Report in corresponding International Application No. PCT/NL2019/050602, dated Jan. 2, 2020 (5 pages).

(Continued)

*Primary Examiner* — Amare Mengistu
*Assistant Examiner* — Sarvesh J Nadkarni
(74) *Attorney, Agent, or Firm* — Leydig, Voit & Mayer, Ltd.

(57) ABSTRACT

A proximity sensitive display element (1) is provided that comprises a light guide (10), at least one light emitting element (30) and at least one infrared radiation sensor (40). The light guide (10) comprises a substrate (11) with a first and a second mutually opposite main sides (12, 14), respectively having a first and a second reflective layer (22, 24), with a reflective inner surface (222, 242) facing inside the light guide. At least one window (16) is defined in the first main side to allow optical radiation to enter and to leave the light guide. The at least one light emitting element (30) is typically embedded in the substrate at its second main side to generate optical radiation in said light guide. The at least one IR-sensor (40) is arranged at the second main side of the (Continued)

substrate and faces the first main side through a semi-transparent patch (240) in the second reflective layer (24).

16 Claims, 10 Drawing Sheets

(56) References Cited

U.S. PATENT DOCUMENTS

| | | | |
|---|---|---|---|
| 2013/0324254 A1 | 12/2013 | Huang et al. | |
| 2014/0197317 A1* | 7/2014 | Yang | H04M 1/72463 250/341.8 |
| 2015/0123938 A1 | 5/2015 | Gecnuk | |
| 2016/0224816 A1* | 8/2016 | Smith | G02B 5/201 |
| 2017/0211973 A1* | 7/2017 | Jia | G01J 1/0474 |

FOREIGN PATENT DOCUMENTS

| | | |
|---|---|---|
| CN | 103150065 A | 6/2013 |
| CN | 105103092 A | 11/2015 |
| CN | 105844212 A | 8/2016 |
| EP | 2214083 A2 | 8/2010 |
| EP | 2568364 A2 | 3/2013 |
| EP | 2657816 A2 | 10/2013 |
| JP | 2010-182066 A | 8/2010 |
| WO | 2010083335 A1 | 7/2010 |

OTHER PUBLICATIONS

Tulbert D J, "Low Cost, Display-Based, Photonic Touch Interface With Advanced Functionality" 2005 SID International Symposium Digest of Technical Papers, Boston, MA, May 24-27, 2005; [SID International Symposium Digest of Technical Papers], Jan. 1, 2005 San Jose, CA: SID, US, vol. 36, pp. 1222-1225 (XP001244347).

China National Intellectual Property Administration, Office Action in corresponding Chinese Application No. 201980075016.X, dated Dec. 10, 2023 (No. translation available).

Japanese Patent Office, Notice of Reasons for Rejection in Japanese Patent Application No. 2021-513452 dated Sep. 7, 2023.

\* cited by examiner

PROXIMITY SENSITIVE DISPLAY ELEMENT

CROSS-REFERENCE TO RELATED APPLICATIONS

This patent application is a U.S. National Phase of PCT International Application No. PCT/NL2019/050602, filed Sep. 16, 2019, which claims priority to European Application No. 18194580.9, filed Sep. 14, 2018, which are both expressly incorporated by reference in their entireties, including any references contained therein.

BACKGROUND

The present invention pertains to a proximity sensitive display element.

WO2015049425 discloses a proximity sensitive display element that is provided as a composite laminate assembly for an electronic device. The assembly provides integrated backlighting for one or more indicator shapes defined by the assembly. The assembly includes a substantially opaque cover member to obscure at least parts of the electronic device. Translucent indicator structures in the cover member define respective indicator shapes to allow backlighting to pass through the cover member. An optical matrix layer of an optically conductive material is attached to an inner face of the cover member, with one or more lighting devices embedded in the optical matrix layer and laterally offset from associated indicator structures. The plurality of lighting devices may be connected to an electric circuit carried on the inner face of the cover member.

The cited document further discloses control elements formed by capacitive buttons. These elements allow capacitive proximity sensing of a user's finger when pressed against the outer face of the cover member so that the user can provide input.

It can be seen in the drawings that control elements formed by capacitive buttons are arranged outside the transparent optical element that defines the indicator window with the indicator structure. For an more intuitive control it is desired that the control elements coincide with a indicator structure. In this way the user can easily associate a certain control element with certain function to be controlled. However, for the known device this would imply that the capacitive elements and/or the leads thereto obscure the indicator structure in the indicator window.

SUMMARY

Hence, it is an object to provide an improved indicator structure, which renders it possible that a control element is provided to determine a human interaction associated with an indicator window without obscuring the indicator structure in the indicator window.

In accordance therewith an indicator structure is provided as claimed in claim 1.

The measures as claimed provide an optical sensor within a light guide.

The IR-sensor is arranged in front of the window and therewith provides for a good sensitivity for human touch or proximity. The sensor, being arranged at the second main side of the substrate does not obscure the indicator structure in the indicator window which is at the first main side opposite the second main side. Nevertheless, for tuning a brightness and/or homogeneity of the illuminated indicator structure, a diffuser may optionally be present in the indicator window. As transmission of optical radiation into the light guide is restricted to the window facing the IR-sensor, the response is selective. I.e. infrared radiation outside the boundary of the window is not transmitted towards the sensor (or of insufficient intensity in comparison). Should the sensor be used for proximity sensing, the sensitivity is limited to an opening angle defined by the window and the distance between the window and the sensor. Therewith the window serves a dual purpose in that it determines the light distribution defining the icon, and determines the spatial angle wherein the sensor is sensitive. A high sensitivity of the sensor may be achieved in that it is arranged in front of the window. The semi-transparent patch in the second reflective layer (partially) conceals the sensor, so that it is not visible through the window, whereas the sensor in this favorable arrangement, receives sufficient IR radiation through the semi-transparent patch as a result of a human approximation or touch in front of the window to properly respond. In addition the sensitivity of the sensor may be tuned by a selection of the properties of the semi-transparent patch, e.g. a transparency of the materials used, or if the patch is provided as a grid, by the openings in the grid. Instead of being responsive to radiation in the middle infrared range (M-IR) corresponding to the wavelength range of radiation emitted by the human body, it is alternatively or additionally possible to have one or more sensors which are sensitive for radiation in the near infrared (N-IR) or visible wavelength range. These may be responsive to radiation which is reflected by a hand or an artificial pointing device towards the display element, for example originating from a dedicated radiation source.

In the context of the present application, sensing a proximity is considered as determining whether a pointing device in particular a user's finger is outside or inside a proximity region of the proximity sensor module. In certain embodiments, the proximity sensor module may further be configured to sense whether it is touched by pointing device in its proximity, and if so, with which pressure.

The sensitivity of the sensor can be further defined by selecting an extent of diffusion. For example to narrow the sensitive spatial angle, a more diffuse material may be used for the light guide.

In an embodiment, the semi-transparent patch is provided as an area wherein said second reflective layer is patterned as a mesh.

In an embodiment the first reflective layer is arranged between the light guide and an opaque layer. A window is defined by a common opening in the first reflective layer and the opaque layer. An opening in the first reflective layer may extend beyond a boundary defined by the window, for example, in order to achieve a reduction in a local hot spot. Also it is conceivable that an opening in the opaque layer may extend beyond a boundary defined by the window. This would imply that the layer with the reflecting surface becomes visible.

The opaque layer may have one or more protrusions extending towards the first main side of the light guide. Therewith a selective absorption is achieved that can be used to improve homogeneity (by reducing a local hot spot).

Also other layers may be provided. These may be transparent, but may also have non-transparent portions outside the window. As an example one or more additional layers may be provided as a barrier to moisture and other substances, and/or to protect an outer surface against scratches.

The light guide may formed by a transparent matrix, such as polycarbonate (PC), PMMA, ABS, TPU, PVB, . . . .

In some embodiments the light guide may be obtained by thermoforming, as specified in European application 18195779.6 from the same applicant, not yet published.

In an embodiment, the at least one IR-sensor is one of a plurality of IR-sensors distributed over the second main side, facing the first main side through a respective semi-transparent patch. In this embodiment, it is further possible to determine a direction of the entity from which the IR-radiation enters the display element. In addition this makes it possible to detect movements and a direction thereof.

According to a further aspect a proximity sensor module is provided that comprises a proximity sensitive display element as described above. In proximity sensor module the IR-sensor is one of a plurality of proximity sensors of a mutually different type, selected from a capacitive sensor, a pressure sensor, a near infrared sensor and a middle infrared sensor, the proximity sensor module further comprising an output unit to generate a resultant proximity signal based on input proximity signals issued by the proximity sensors. A controller of the proximity sensor module may perform an analysis that indicates the reliability and accuracies of the various sensor signals and provide a resultant proximity signal, for example a selected one of the sensor signals or a signal indicative of a weighted sum of distances indicated by the input sensor signals depending on the indicated reliabilities and accuracies.

Embodiments of the proximity sensor module may comprise an optical radiation sensor to receive a portion of optical radiation emitted by the at least one light emitting element that is reflected by a human finger via an outer surface of said at least one window in a direction towards said optical radiation sensor. Light that is emitted by the at least one light emitting element through the translucent window, is partially reflected by the human finger back through the window, towards the optical radiation sensor. In response thereto, the optical radiation sensor generates a sense signal representative for said received optical radiation. The inventors have found that the sense signal is suitable to be processed by a signal processor to derive a proximity signal indicative for an extent to which the human finger is in the proximity of the outer surface of the window and that the proximity signal may further indicate if the outer surface is touched, and if so, with which pressure.

As a first approach, the signal processor bases an estimation of a proximity to be indicated by the proximity signal on a magnitude indicated by the sense signal. Typically more optical radiation is reflected if the users finger more closely approximates the at least one window and the amount of reflected radiation still further increases if the pressure with which the user touches the window increases. In practice using a signal indicative for a single component indicative for a sensed intensity of radiation in a spectral range may work well if the proximity sensor module is used by a single user.

Should however the proximity sensor module be for use by different users, having mutually different skin color and/or blood circulation conditions a more robust pressure/proximity indication may be obtained in embodiments of the proximity sensor module wherein the optical radiation sensor is configured to provide the sense signal with at least a first and a second signal component indicative for a respective spectral component in the received optical radiation. The inventors noted in particular that the composition of the optical spectrum reflected by the human finger strongly depends on the pressure exerted therewith. In an embodiment the respective spectral components in the received optical radiation are a red spectral component and a green spectral component. In particular the pressure dependency of the measured contribution for these spectral ranges mutually differs significantly, so that more information is available to distinguish changes due to pressure from other effects.

If various types of sensors are provided, the selection or weighting may for example be determined on a first estimation of the distance between the entity for which the proximity is to be detected and the surface of the display. Given the sensitivity ranges of the various proximity sensors the controller can determine a reliability with which the sensors indicate the distance and determine from which of these sensors the sensor signal has to be selected or which weighting should be applied.

It was further recognized by the inventors that in known products, a visual feedback in response to user input may not be visible due the fact that the users finger exactly covers the location where visual feedback is given. This could be circumvented by providing visual feedback at a location other than the touched location, but this may confuse the user. To that end, the present disclosure provides further embodiments which are provided with a touch sensor to issue a sense signal indicative for an extent to which the outer surface of the at least one window is touched by a human finger. The proximity sensor module is further provided with a controller coupled to the touch sensor to receive the sense signal. The controller at least has a first operational mode to be assumed if the sense signal indicates that said outer surface is not touched, and at least has a second operational mode to be assumed if the sense signal is indicative for a detection that said outer surface is touched by the human finger. The controller is coupled to the at least one light emitting element to provide a drive signal to control the controllable light source dependent on the operational mode, such that in the second operational mode, light irradiated from the controllable light source is perceivable through the human finger. Therewith the user can observe the visual feedback at the location covered by the finger. The operation of the light source may further be dependent on expected or sensed environmental conditions. For example, for indoor applications, generally a lower intensity suffices than for outdoor applications. Predetermined settings may be used depending or the application, or a light sensor may be provided that senses the brightness of the environment where the application with the touch sensitive graphical user interface is used. Also control means may be provided to control the settings according to user preferences, for example an operator may select a setting with a higher light intensity in the second operational mode for a better visibility, to compensate for a less translucent skin, or in circumstances wherein the operator's attention cannot be directly focused to the touch sensitive graphical user interface.

In an embodiment, in said second operational mode, the spectrum of the light irradiated by the at least one light emitting element is dominated by radiation having a wavelength in the range of 650-800 nm, Optical radiation in this range in particular optical radiation in the range of 700-780 nm is transmitted relatively well through the human skin. Therewith light with a relatively low intensity suffices to provide the visual response. In an embodiment of that embodiment, in the first operational mode, at least a contribution of a red component in the light irradiated by the at least one light emitting element is substantially lower than a contribution of a red component in the second operational mode. Therewith it is clearly visible to the operator whether or not the controller has assumed the second operational mode, or remains in the first operational mode. In the first operational mode, the controllable light source may be switched off by the drive signal. Alternatively, the controllable light source may be driven at a relatively low intensity differing from 0, so that the controller can easily recognize the control area. It may even be considered that the controllable light source is driven at a medium intensity so that the some light is visible through the human finger even if the controller fails to assume the second operational mode. Provided that in the first operational mode, at least a contribution of a red component in the light irradiated by the controllable light source is substantially lower than a contribution of a red component in the second operational mode, the operator can still visually distinguish the erroneously assumed first operational mode from the second operational mode. It may be contemplated that the response of the controller has a small delay, e.g. 0.5 to 1.5 s, so that the operator can easily compare the relatively low intensity of the radiation shining through the finger directly after touching the control area and the relatively high intensity of the radiation in the second operational mode after the delay.

Alternatively, or additionally, the controller may drive the light source in modulated manner. For example, in the first operational mode the light source may be driven in a continuous manner, and in the second operational mode the light source may be driven in a modulated manner. In another example, in the first operational mode the light source may be driven in a modulated manner, and in the second operational mode the light source may be driven in a continuous manner. In both example, the operator can clearly distinguish the first operational mode from the second operational mode. The latter example has the additional advantage that the modulated operation of the light source in the first operational mode helps to focus the attention of the operator to the fact that input can be provided by touching the control area. In a still further example, in both the first operational mode and the second operational mode the light source is modulated, however in a different manner, for example with a different frequency and/or with a different duty-cycle.

In some embodiments, the touch sensor may be a pressure sensor, and the controller may be configured to issue the drive signal in a manner dependent on a pressure as indicated by said pressure sensor. Therewith the operator has more control options available without requiring additional area of the touch sensitive graphical user interface, and the operation of the light source as visible through the human finger provides feedback about the effect achieved.

In an embodiment of the proximity sensor module the contribution of the red component is positively correlated with an amount of pressure exerted by the human finger on the outer surface. The response by a contribution of the red component that is positively correlated with an amount of pressure exerted by the human finger on that area, is intuitively clear to the operator. This may for example be the case in that the second operational mode of the controller includes at least a first sub-mode to be assumed if the sense signal indicates that an amount of pressure exerted by the human finger on that area is less than a predetermined threshold value and a second sub-mode to be assumed if the sense signal indicates that an amount of pressure exerted by the human finger on that area is at least equal to the predetermined threshold value, wherein the controller is configured to issue the drive signal such that a contribution of the red component in the second sub-mode is higher than in the first sub-mode. As an example the controller may provide for a ternary response corresponding to the first operational mode (no touch detected), a first sub-mode of the second operational mode (touch detected with at most a modest pressure) and a second sub-mode of the second operational mode (touch detected with a relatively high pressure). These three operational modes can be easily distinguished from each other by the brightness (low, medium, high respectively) of the light source as visible through the human finger. The second operational mode may comprise in addition to the first and the second operational sub-mode one or more further sub-mode, each corresponding to a respective range for a sensed pressure. Alternatively, it may be the case that the contribution of the red component is positively correlated with an amount of pressure exerted by the human finger on that area in that the controller is configured to issue the drive signal such that a contribution of the red component in the second operational mode is a continuously increasing function of the exerted pressure as indicated by the sense signal.

In case the contribution of the red component is positively correlated with an amount of pressure exerted by the human finger, the response as perceived may be slightly biased in that the light irradiated by the light source is better transmitted through the human finger when exerting a higher pressure. It may be contemplated to compensate for this effect. In a still further embodiment, the controller is configured to issue the drive signal such that a contribution of the red component is modulated in accordance with an amount of pressure exerted by the human finger on that area. E.g. in the ternary case, a touch with modest or low pressure may be signaled with a continuously emitting light source, and a touch with relatively high pressure may be signaled with intermittently operating light source, e.g. flashing each second As a further alternative, a continuous relationship may be provided between the sensed pressure and the modulation frequency.

Measures may be taken to avoid that light with a relatively high intensity as required to penetrate through the human skin is directly visible. This may be achieved in that the controller does not assume the second operational mode until the control area is fully covered with the human finger. The measure of providing a delay in the response to a touch detection also can contribute in a reduction of directly visible radiation.

The amount of visible radiation may be restricted by properly selecting the width of the beam of illumination of the light source. Alternatively, or in addition the control area may be explicitly delimited by a translucent window within an opaque zone. The illumination area as defined by the translucent window and/or by the width of the beam of the light source may be relatively small, e.g. a few mm2, e.g. a circular or square area that can easily be fully covered by the human finger The touch sensitive graphical user interface may be provided with a plurality of laterally distributed control areas. Each control area may have a respective pair of a touch sensor and an associated controllable light source. Control of the associated light sources may be provided according to the embodiments presented above. In some embodiments the light sources may be controlled in the same manner. This is advantageous in that the control areas provides a consistent visible response to the operator. In other circumstances, for example in professional applications it may be advantageous that different response types are provided for different control areas. For example in one control area the visible response may be an increased light intensity and in an other control area the visual response may be a fluctuating light intensity upon detection of a touch. In an embodiment a common controller may be provided that controls each of the controllable light sources. in accordance with the sense signal provided with by its associated touch/pressure sensor. Alternatively each pair of a touch sensor and its associated controllable light source may have a dedicated controller.

According to a further aspect a method of sensing proximity to a display element is claimed in claim 24.

Embodiments of said method may comprise:

sensing whether an outer surface of said at least one window (16) is touched by the human finger;

controlling the at least one light emitting element according to an operational mode selected from at a first operational mode and a second operational mode, wherein the first operational mode corresponds to the sense signal indicating that the control area is not touched, and the second operational mode) corresponding to the sense signal indicating that the control area on the touch surface is touched by the human finger, and controlling the at least one light emitting element such that light irradiated therewith is perceivable through the human finger.

Embodiments of said method may additionally or alternatively comprise generating a sense signal which is indicative for optical radiation emitted by the at least one light emitting element, and reflected by the human finger through the translucent window;

computing an indication for a pressure exerted by the human finger from said sense signal.

The latter embodiments may further comprise determines a change of the sense signal in time. It has been recognized by the inventors, that instead of evaluating momentary signal values in isolation a more accurate proximity/pressure sensing is achieved by determining how the sensed signals change as a function in time. Additionally or alternatively a still further accuracy may be achieved in embodiments wherein the sense signal at least includes a first and a second component indicative for a respective spectral component in the received optical radiation and the method comprising determining whether or not a relative change of the first component is equal to a relative change of the second component.

BRIEF DESCRIPTION OF THE DRAWINGS

These and other aspects are described in more detail with reference to the drawings. Therein:

FIG. 8A shows a front view and FIG. 8B shows a cross-section according to VIIIB-VIIIB in FIG. 8A;

DETAILED DESCRIPTION OF EMBODIMENTS

Figure 1:
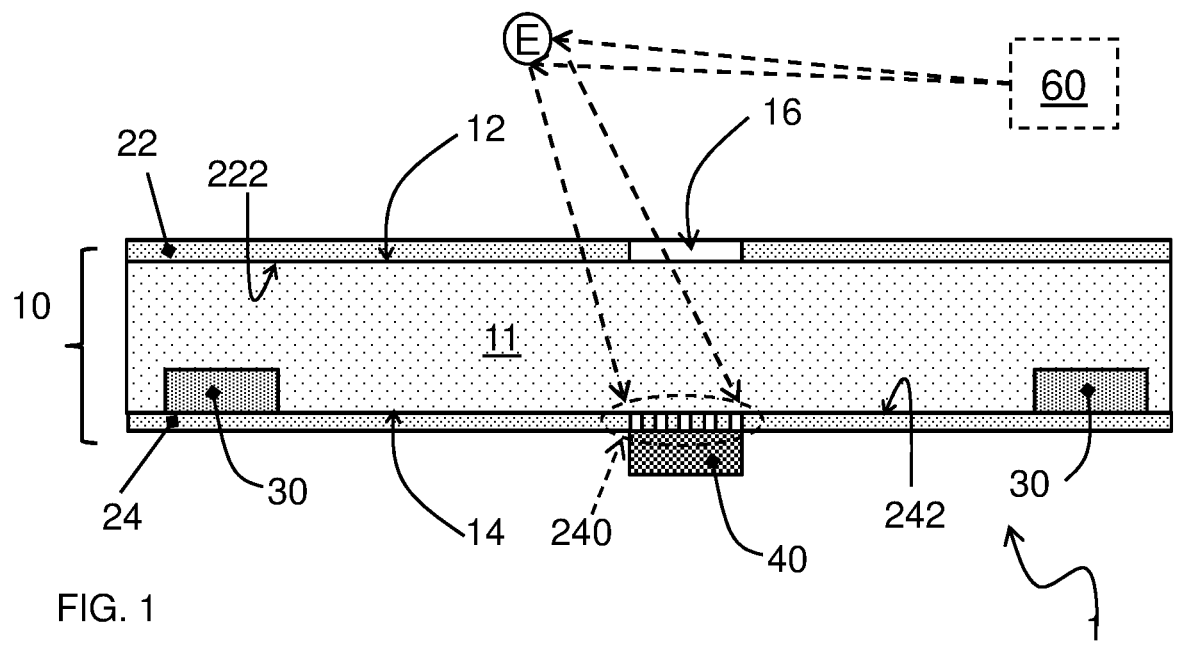
FIG. 1 schematically shows a cross-section of an embodiment of the proximity sensitive display element.

FIG. 1 schematically shows a cross-section of a proximity sensitive display element 1. The proximity sensitive display element 1 comprises a light guide 10, at least one light emitting element 30 and at least one infrared radiation sensor 40, in the sequel also denoted as IR-sensor.

As shown in FIG. 1 the light guide 10 comprises a substrate 11 with a first main side 12 and a second main side 14 opposite thereto. The first main side 12 has a first reflective layer 22, and the second main side 14 has a second reflective layer 24. The first and the second reflective layer 22, 24 each have a reflective inner surface 222, 242 facing inside the light guide. In the embodiment shown the reflective layer 24 serves as a substrate which may carry additional components, such as the IR-sensor. In other embodiments, the reflective layer may be arranged on a separate substrate at a side opposite its side with the reflective inner surface 242. At least one window 16 is defined at the first main side 12 to allow optical radiation to enter and to leave the light guide. The at least one light emitting element 30, for example a LED, is embedded in the substrate 11 at its second main side 14 to generate optical radiation in said light guide. In this example the at least one light emitting element 30 is one of a pair of light emitting element 30. Alternatively a different number light emitting elements 30 may be provided. The at least one IR-sensor 40 is arranged at the second main side 14 of the substrate 11. The at least one IR-sensor faces the first main side 12 through a semi-transparent patch 240 in the second reflective layer 24.

In an embodiment the substrate 11 may for example be provided from a thermoplastic material, for example PC, PMMA, TPU, PVB or another thermoplastic resin In an embodiment, the display element 1 may for example have a surface area in the order of a few cm by a few cm, e.g. 2×2 cm. The at least one IR-sensor may have lateral dimensions in the order of a few mm, e.g. 2×2 mm.

Figure 2:
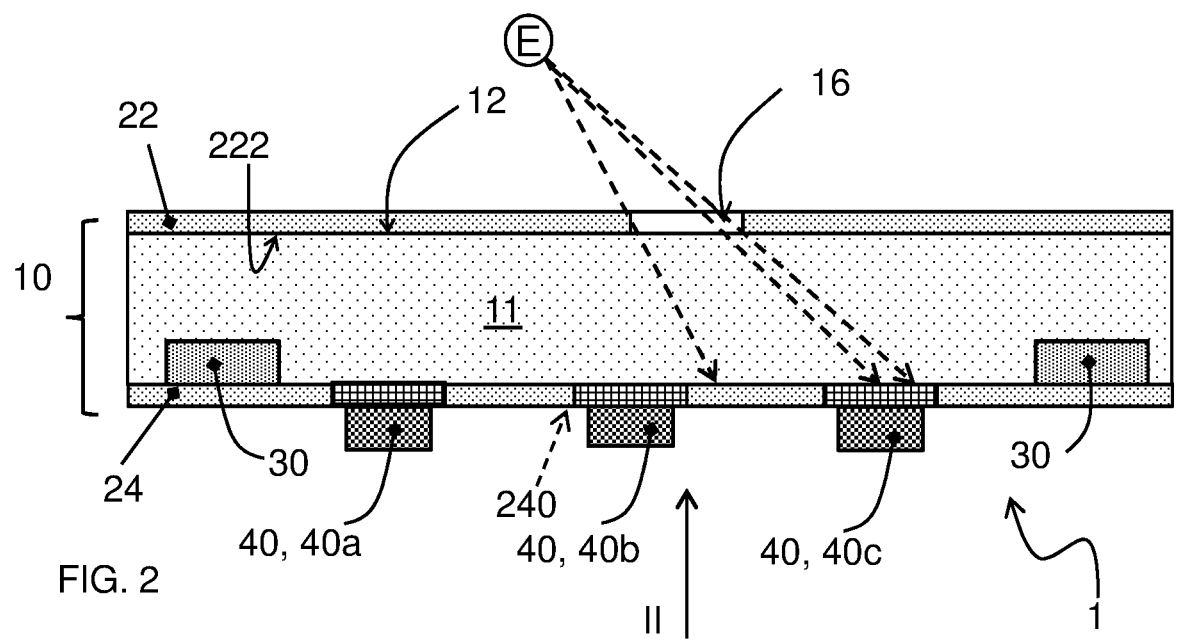
FIG. 2 schematically shows a cross-section of a further embodiment of the proximity sensitive display element.
Figure 2A:
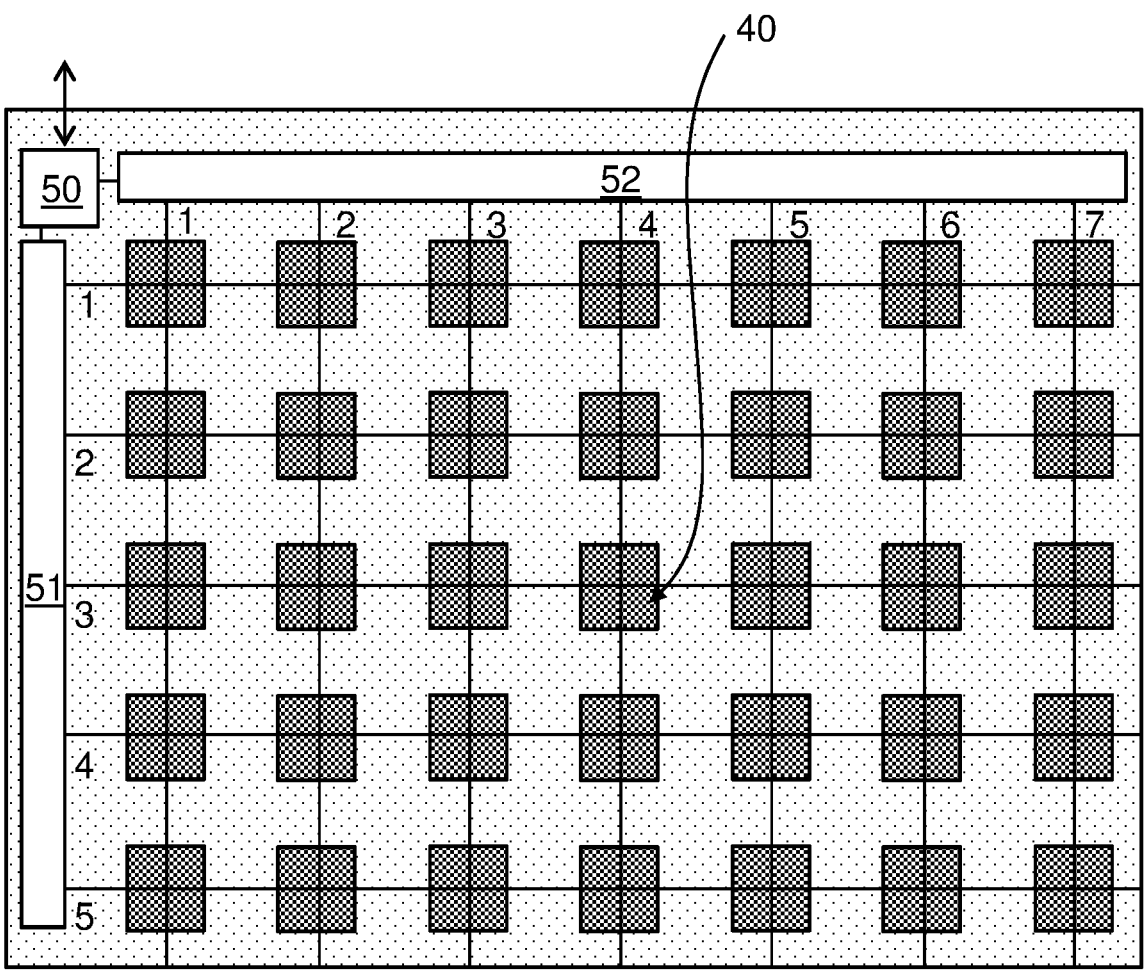
FIG. 2A shows rear view of said further embodiment according to II in FIG. 2.

FIG. 2 shows an embodiment of the proximity sensitive display element 1. The proximity sensitive display element 1 shown therein comprises a sensor array with a plurality of IR-sensors distributed over the second main side 14 facing the first main side 12 through a respective semi-transparent patch. The at least one IR-sensor (40) is one of said IR-sensors. The sensor array with the IR-sensors may be integrated in a single component, for example if the surface area is relatively small, or may be provided as separate components, each with a single IR-sensor or with a subset of the array if the surface area is larger. The IR-sensors may be individually addressable to read a sensed value from each of them. For example, in the embodiment shown in FIG. 2A corresponding to view II in FIG. 2, the specified at least one IR-sensor 40 is addressed with index 3 by a row address unit 51 and index 4 by a column address unit 52. A controller 50 is provided as an interface with an external signal processing device (not shown) and to control the row address unit 51 and the column address unit 52. This makes it possible to detect a direction from which an entity E (e.g. a users finger) approaches the display and facilitates a better discrimination of user input from IR-radiation received from other sources. For example with the knowledge that entity E is a driver having a predetermined position to the display screen it can be assumed that the driver input comes from a particular direction, and that other detection signals result from other sources, e.g. due to solar radiation.

Figure 3:
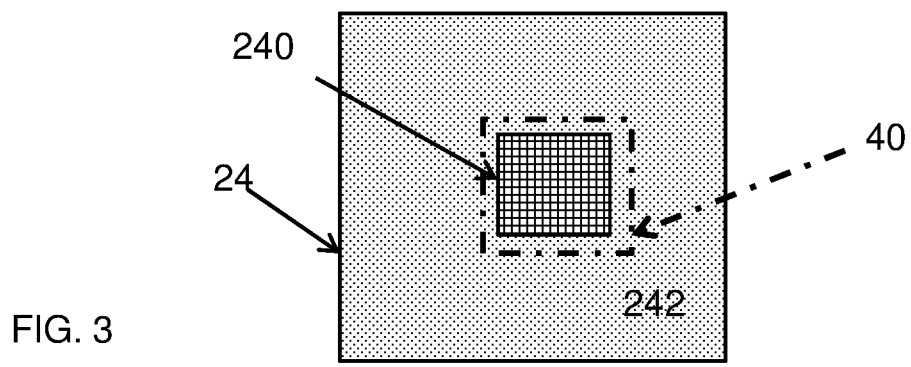
FIG. 3 shows a portion of a second reflective layer in an embodiment of the proximity sensitive display element.

FIG. 3 shows a portion of the second reflective layer 24 in an embodiment of the proximity sensitive display element. The portion is shown from the side of its reflective inner surface 242. The semi-transparent patch 240 for the IR-sensor 40 (contour shown in dashed lines) is provided as an area wherein said second reflective layer 242 is patterned as a mesh.

Figure 4:
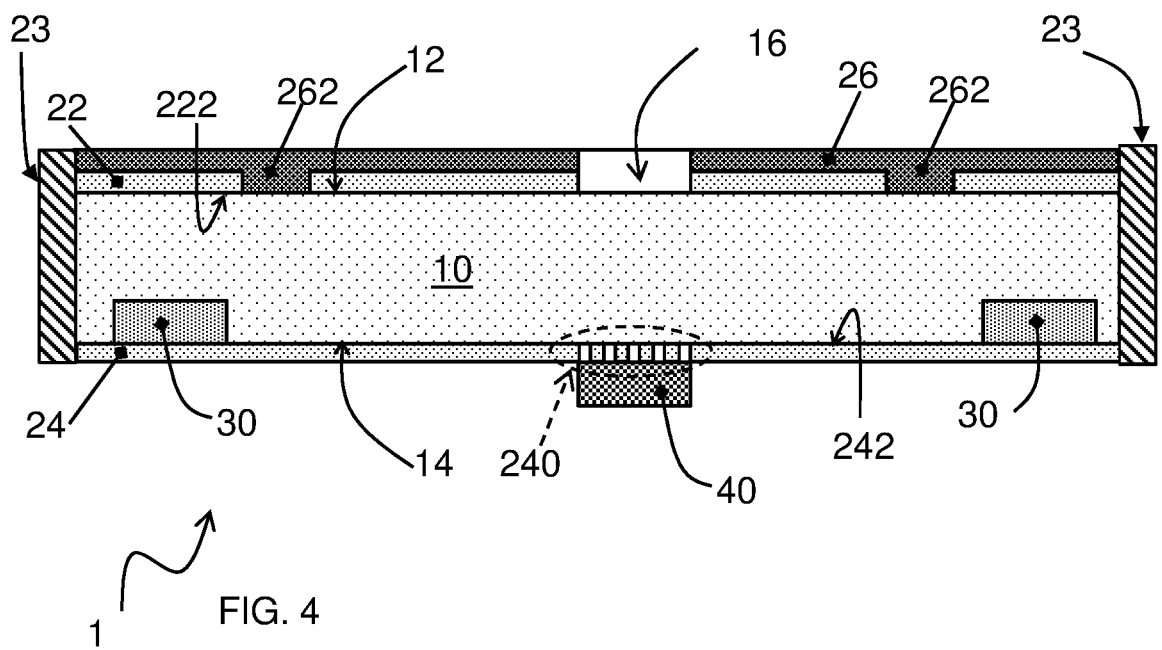
FIG. 4 schematically shows a cross-section of a still further embodiment of the proximity sensitive display element.

FIG. 4 shows an embodiment of the proximity sensitive display element wherein the first reflective layer 22 is arranged between the light guide 10 and an opaque layer 26. The opaque layer 26 may have a pattern of icons to be displayed to an observer. In the embodiment shown in FIG. 4, the opaque layer 26 has one or more protrusions 262 extending towards the first main side 12 of the light guide. Therewith an intensity distribution visible at the first main side 12 may be controlled. In the embodiment shown in FIG. 4 the first reflective layer 22 is coupled to end portions 23, for example a polymer, such as a polycarbonate which may have a width in the range of a few hundred, e.g. 250 micron, to a few mm, e.g. 2 or 3 mm.

The wavelength range of the at least one IR-sensor 40 may be selected depending on the circumstances where the display element is used. In case the use is in relatively low temperature environments, the at least one IR-sensor may be provided as an M-IR sensor. In that case the sensor 40 can detect infrared radiation in the wavelength range of the human body. In case heat sources may be present, for example in a car that was exposed to the sun, objects will typically radiate in the same range and cause false positives. In that case a near infrared N-IR sensor, or even a sensor for detection in the visible range, may be selected as the at least one IR-sensor 40. Such a sensor may be combined with a suitable radiation source (60, FIG. 1, illustrated in dashed lines) that is arranged in a manner wherein its emitted radiation can be reflected towards the sensor 40 by the entity to be detected, but cannot directly reach the sensor.

Figure 5:
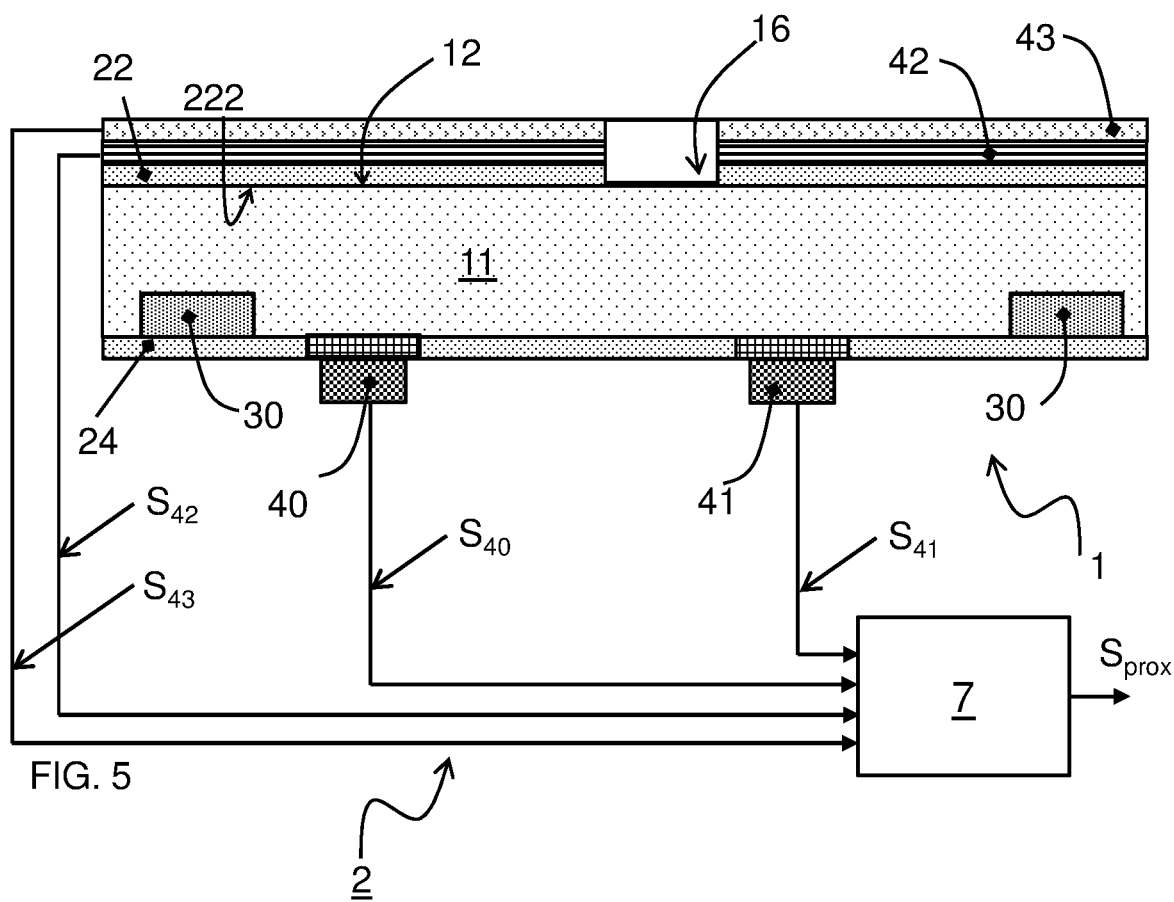
FIG. 5 schematically shows an embodiment of a proximity sensor module comprising an embodiment of a proximity sensitive display element.

A proximity sensor module 2, as shown in FIG. 5, may comprise a proximity sensitive display element 1 for example according to one of the embodiments presented with reference to FIG. 1-4. In the embodiment of the proximity sensor module 2 shown in FIG. 5, the IR-sensor 40, here an M-IR sensor is one of a plurality of proximity sensors of a mutually different type. In this embodiment shown the proximity sensor module 2 further includes an N-IR sensor 41, a capacitive sensor 42, and a pressure sensor 43. The proximity sensor module 2 further comprises an output unit 7 to generate a resultant proximity signal $S_{prox}$ based on input signals $S_{40}$, $S_{41}$, $S_{42}$, $S_{43}$ issued by the proximity sensors 40, 41, 42, 43. A pressure sensor may be provided in the form of a ring around the window 16.

Figure 6:
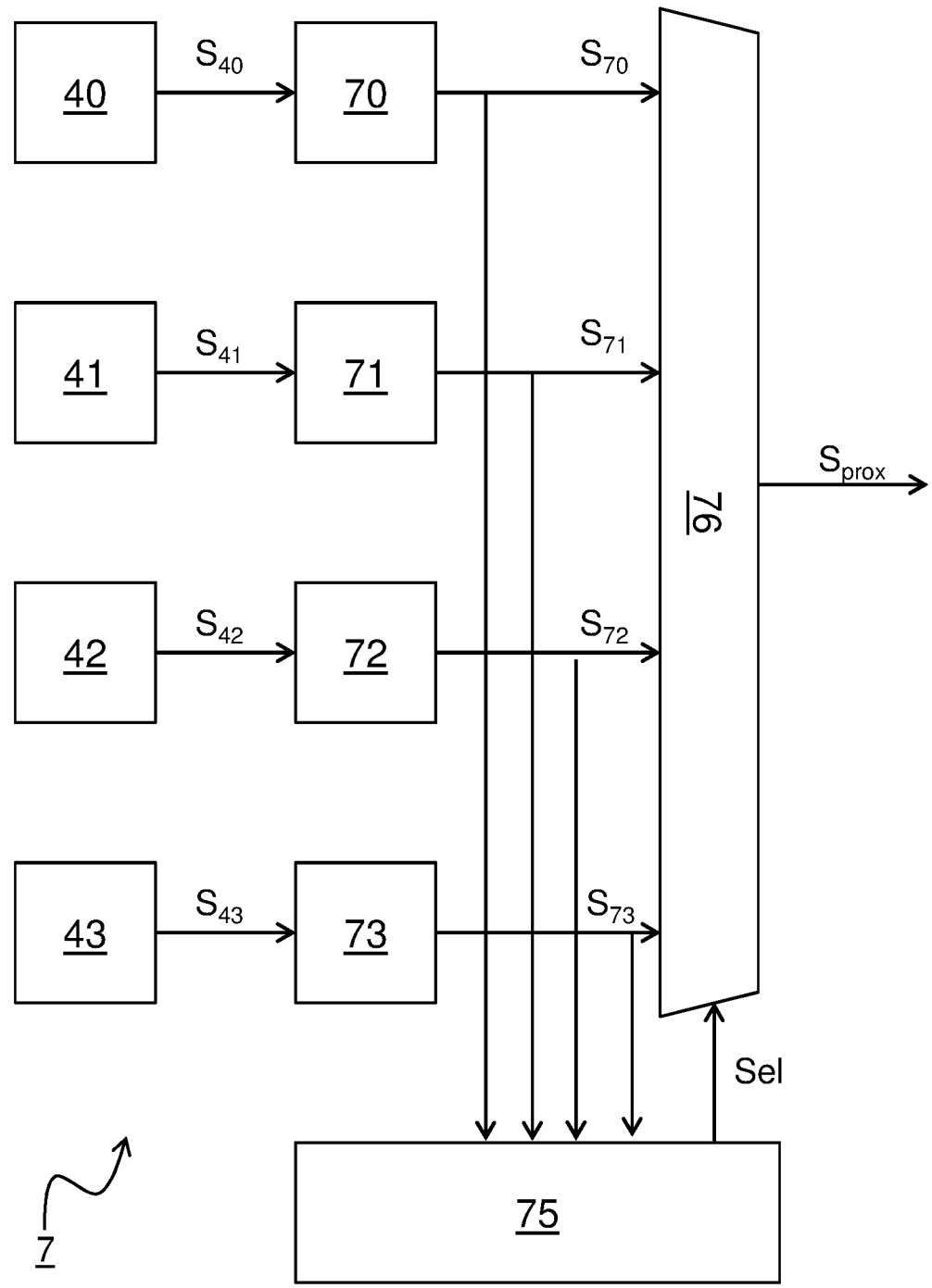
FIG. 6 shows an output unit forming part of the proximity sensor module of FIG. 5 in more detail.

FIG. 6 shows an embodiment of the output unit 7 in more detail. The output unit 7 comprises for each of the sensors 40, 41, 42, 43 a respective preprocessing unit 70, 71, 72, 73 that provide a normalized output signal $S_{70}$, $S_{71}$, $S_{72}$, $S_{73}$ in response to the input signals received from the sensors. The output signals are normalized in the sense that a same signal value of the signals output signal $S_{70}$, $S_{71}$, $S_{72}$, $S_{73}$ represents a same distance of the entity E to the surface of the display 1. A controller 75 receives the (normalized) output signals signal $S_{70}$, $S_{71}$, $S_{72}$, $S_{73}$, determines which of these signals provides the most reliable indication of the distance and provides a selection signal Sel that causes a selection element 76 to select the signal determined as the most reliable. The controller may for example determine that the plurality of normalized signals $S_{70}$, $S_{71}$, $S_{72}$, $S_{73}$, indicates that the distance between the entity and the surface of the display is within a particular range and select the one of the normalized signals that corresponds to the detector which typically has the best performance in that range. A normalization to determine the selection may be obviated, if the selection from the sensors is made in a fixed order, e.g. the order of pressure sensor, capacitive sensor, NIR-sensor and MIR-sensor. In other words, if one of these sensors is currently selected to determine the distance, and it is detected with that currently selected sensor that the detected distance is at the lower/higher boundary of its assigned detection range, the sensor assigned to the detection range having the corresponding higher/lower boundary is selected. Alternatively, or in addition it may base the selection on a reliability indicator provided by a detector or by its preprocessor. Still further it is conceivable that the output unit 7, instead of a selection element 76 has a weighted adder that computes a weighted sum of the normalized signal values, wherein the weights assigned to the signal values are positively correlated with, e.g. proportional to their reliability, and the weights add up to 1.

Figure 7:
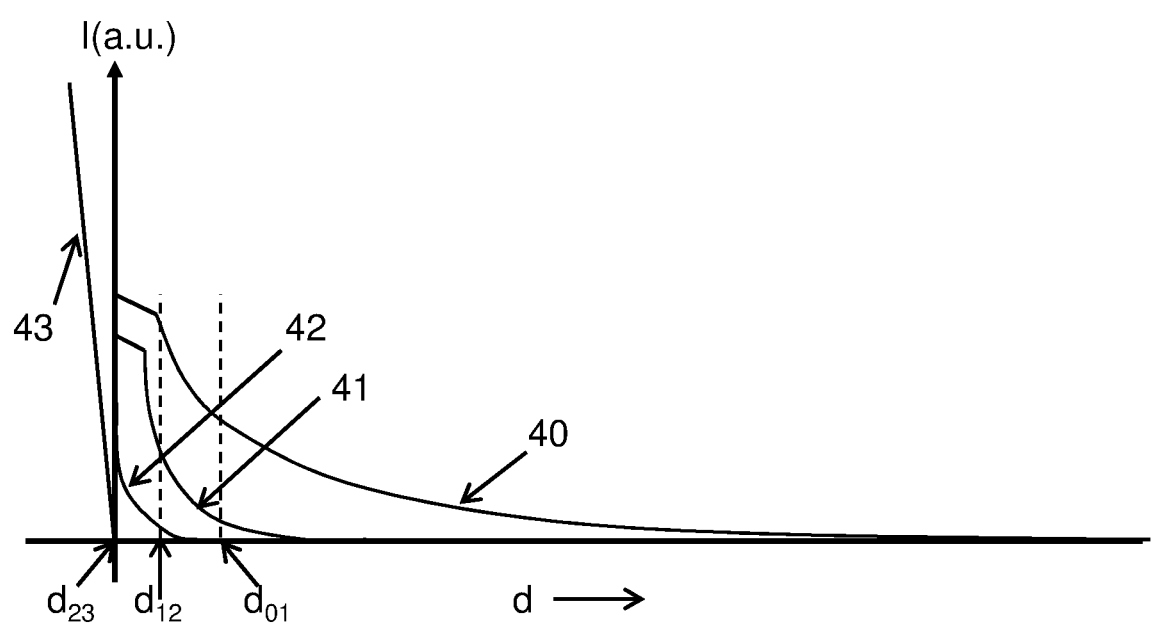
FIG. 7 schematically shows a responsiveness of various sensors in said embodiment of the proximity sensor module.

FIG. 7 schematically shows the responsiveness of the sensors 40-43 as a function of the distance d. The M-IR sensor 40 is particularly suitable for relatively large ranges $(d>d_{01})$ e.g. from a few dm and higher, up to a few meters, the N-IR sensor 41 for intermediate ranges $(d_{12}<d \le d_{01})$, e.g. from a few cm to a few dm, the capacitive sensor 42 for short ranges $(d_{23}(=0)<d \le d12)$ in the order of a few cm, and the pressure sensor 43 for negative ranges (pressed in). The controller 75 may estimate the distance d, from the normalized output signals $S_{70}$, $S_{71}$, $S_{72}$, $S_{73}$, and subsequently cause the selection element 76 to select the normalized output signal associated with the sensor having the detection range including the estimated distance.

Figure 8A:
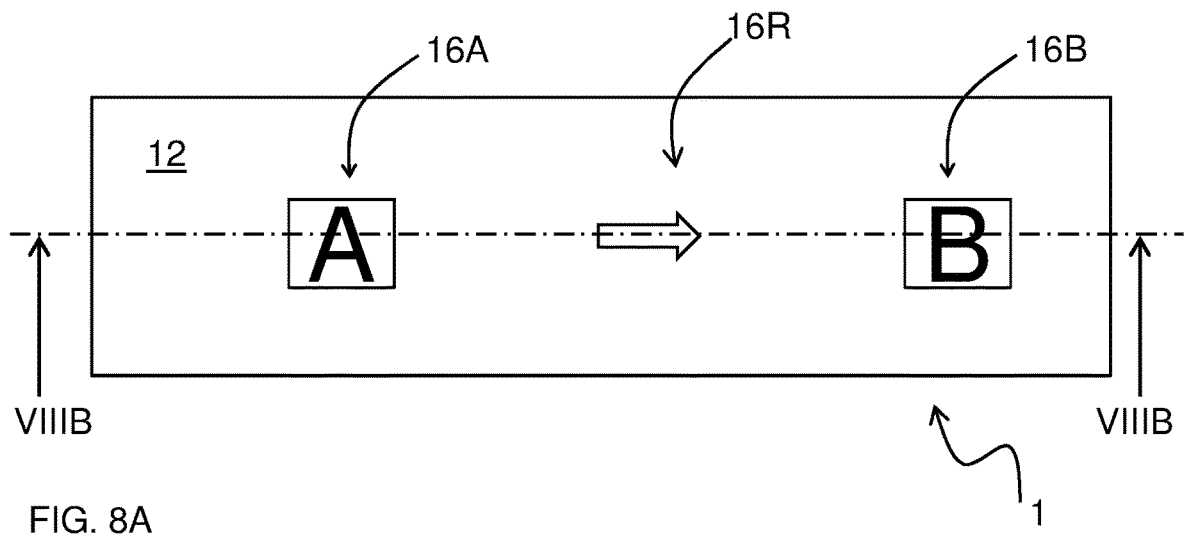
FIG. 8A, 8B schematically show a further embodiment of a proximity sensor module; Therein
Figure 8B:
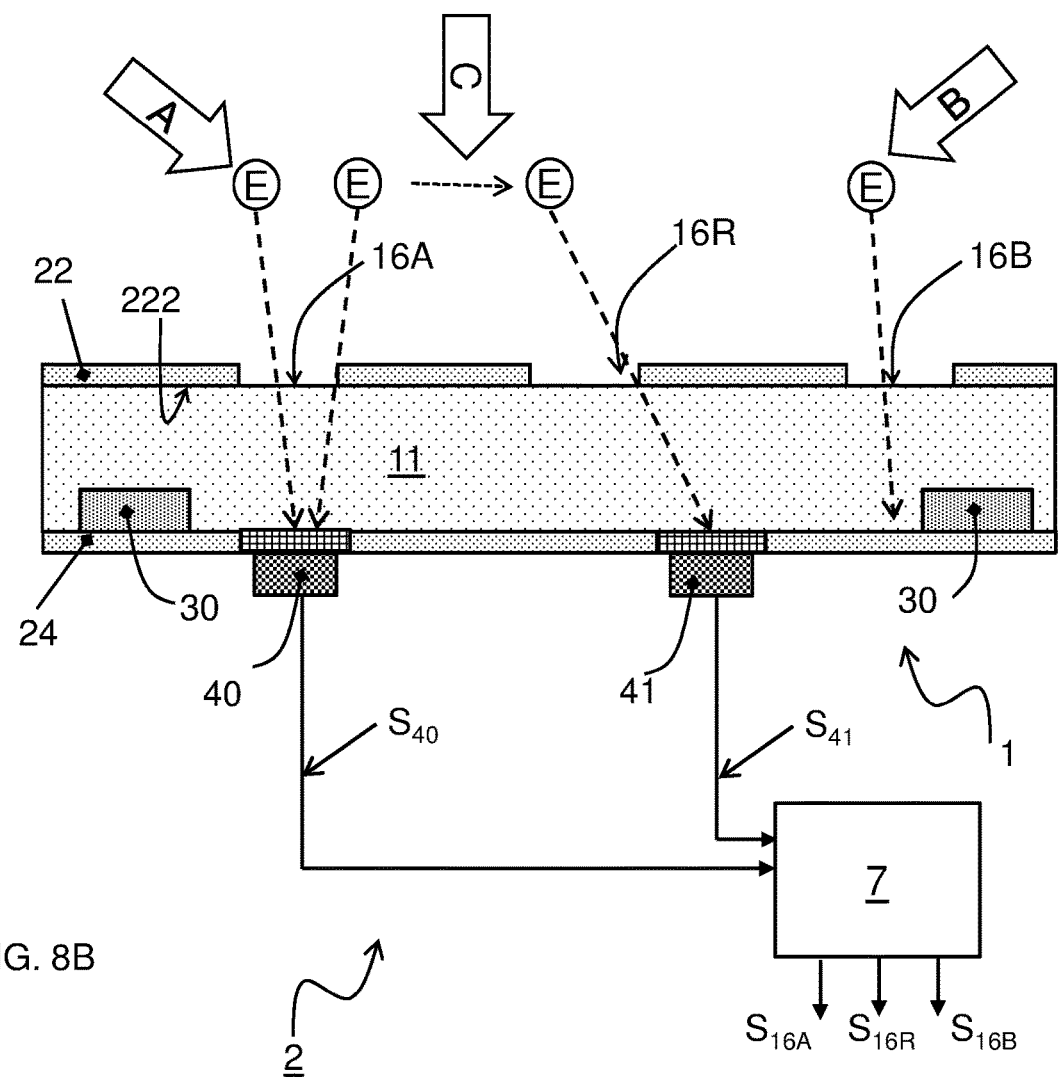

FIG. 8A, 8B schematically show a further embodiment of a proximity sensor module. Therein FIG. 8A shows a front view and FIG. 8B shows a cross-section according to VIIIB-VIIIB in FIG. 8A. In this embodiment windows 16A, 16R and 16B are defined at the first main side 12 of the light guide. The windows 16A, 16R and 16B are formed as an icon. The icon 16R represents an arrow. The proximity sensor module has a first and a second IR-sensor element 40, 41. The controller 7 may analyze their signals to detect the following cases.

A: An relatively strong, stationary input signal $S_{40}$ is received from sensor 40. This may be indicative of a selection of an option corresponding to the icon A.

B: An relatively strong, stationary input signal $S_{41}$ is received from sensor 41. This may be indicative of a selection of an option corresponding to the icon B.

C: A diminishing input signal $S_{40}$ is received from sensor 40, while an input signal $S_{41}$ of increasing strength is received from sensor 41. This may be indicative of a selection of an option corresponding to the icon R. The response by the controller may be sensitive to the direction in that it only recognizes this time-dependency as an indication that the user selects option C, while ignoring a time-dependency in the input signals $S_{40}$, $S_{41}$ in the opposite sense.

Figure 9A:
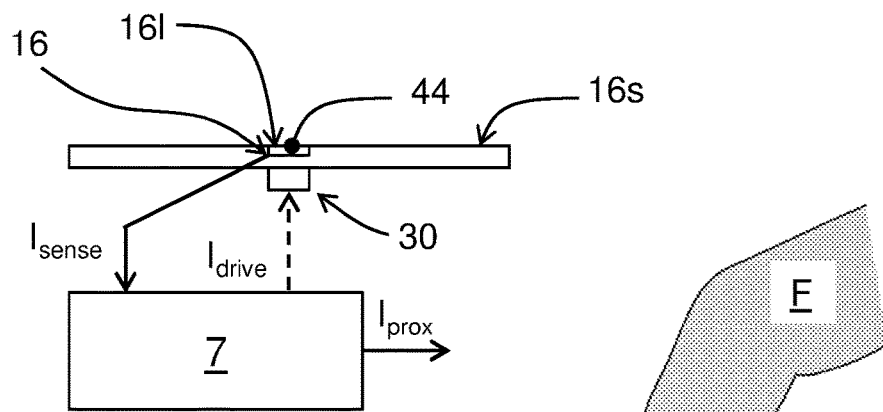
FIG. 9A, 9B schematically show a further embodiment of a proximity sensitive display element.
Figure 9B:
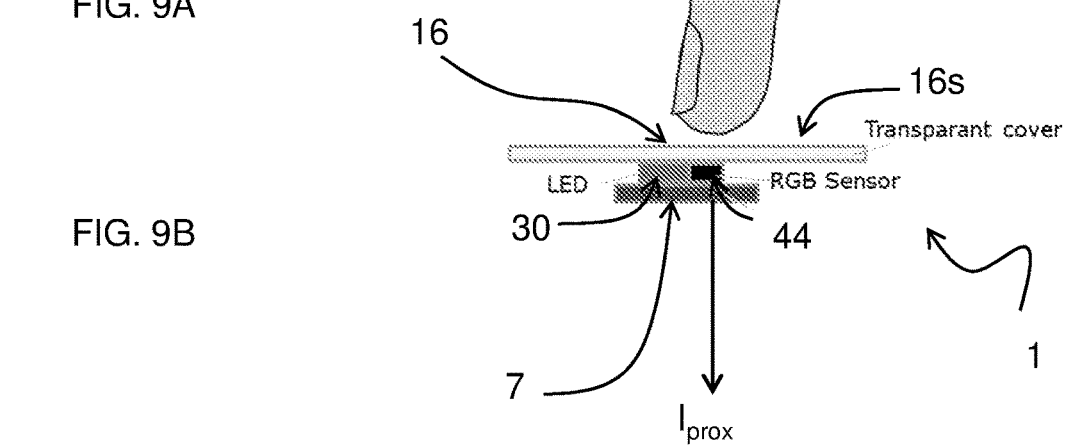

FIG. 9A, 9B schematically show a further embodiment of a proximity sensor module for a proximity sensitive display element. In this embodiment, the proximity sensor module comprises an optical radiation sensor 44. A portion of optical radiation from the light emitting element 30 that is transmitted through the window 16, may reflect from a surface of a human finger F, at or near the outer surface 161 of that window, and be transmitted back via the window 16 towards the optical radiation sensor 44. The optical radiation sensor 44 is configure, to in response thereto generate a sense signal Isense representative for the received optical radiation. The signal processor 7, which is coupled to the optical radiation sensor is configured to receive the sense signal, and to generate in response thereto a proximity signal Iprox indicative for an extent to which the human finger is in the proximity of the outer surface 161. The proximity signal Iprox may further indicate if the outer surface 161 is touched, and if so, with which pressure.

Figure 10A:
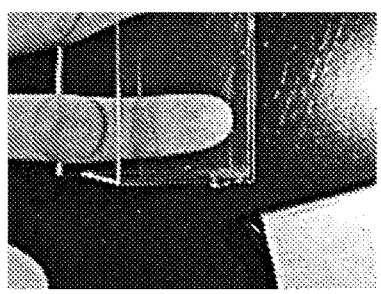
FIGS. 10A, 10B and 10C illustrate aspects of a method wherein said embodiment is used.
Figure 10B:
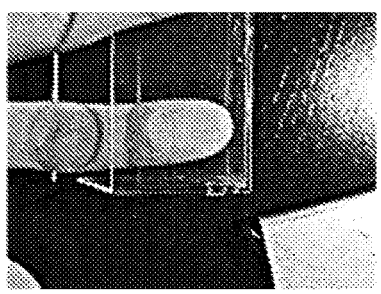
Figure 10C:
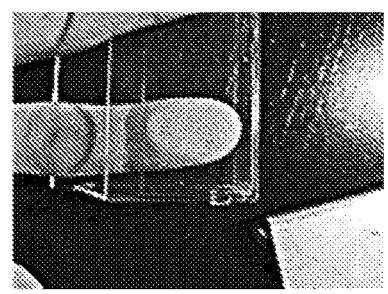

An embodiment of the device was prepared using a white light emitting LED as the light emitting element 30 and an apds-9960 sensor as the optical radiation sensor 44. The pictures of FIGS. 10A, 10B and 10C are taken from a location opposite the touch surface 16s with respectively a low finger pressure, a modest finger pressure and a strong finger pressure.

Figure 11:
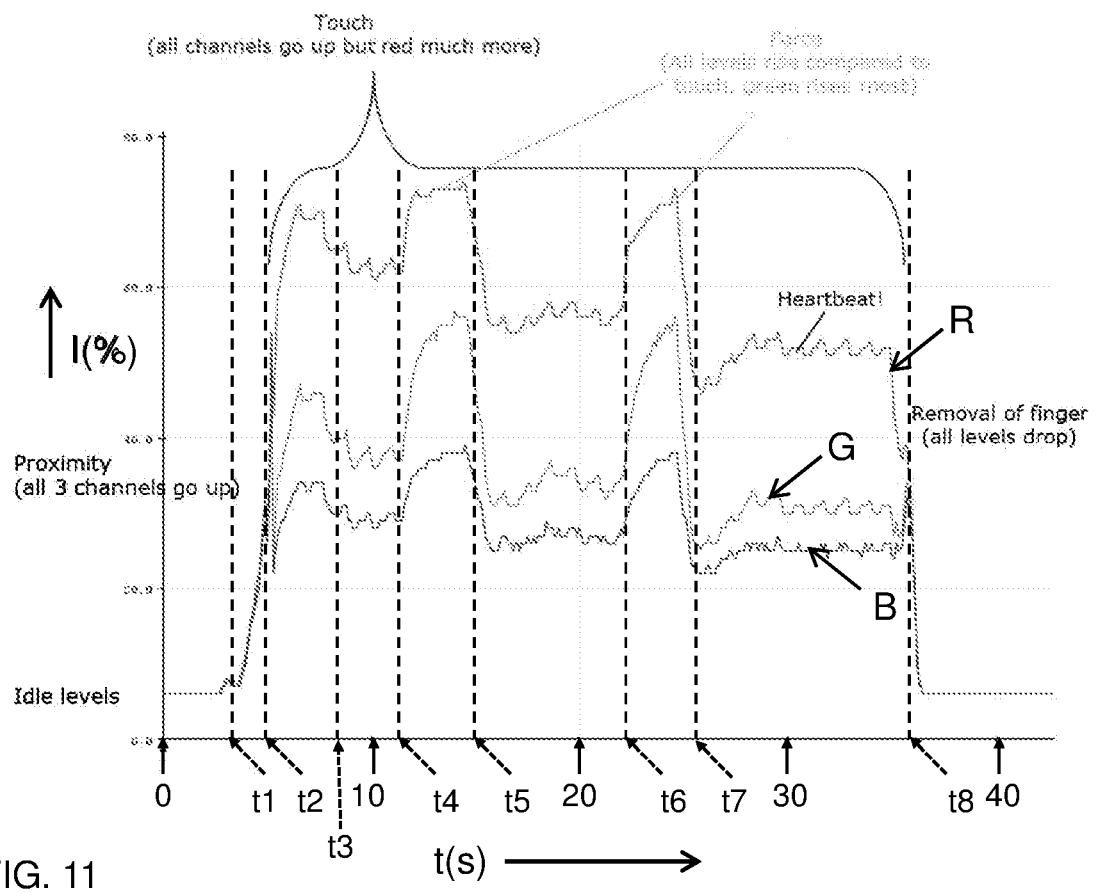
FIG. 11 depicts sense signals as a function of time during said use.

FIG. 11 depicts sense signals obtained from the optical radiation sensor 44 as a function of time. The sense signals R, G, B, indicative for the red component signal, the green component signal and the blue component signal are expressed as a percentage of their nominal value.

In a time-interval from t=0 to t=t1 (+/−3 s), the human finger is outside detection range, and the signals R,G,B assume an idle level of about 5%, possibly by internal reflections at the inner and outer surfaces of the window 16.

In a time-interval from t1−t2(+/−4 s), the finger approaches the outer surface 161 of the window 16, which results in a joint increase of all signal levels. FIG. 10A shows the situation at point in time t2.

Subsequently in the time-interval t2−t3 (8 s), the pressure is increased from substantially 0, as shown in FIG. 10A, via an intermediate pressure (FIG. 10B), to a high pressure as shown in FIG. 10C. As compared to the state in FIG. 10A, the relative contribution of the R-component is higher than that of the other components G,B regardless the exerted pressure P, I.e. if P>0, the R>G>B.

However, the ratio R/G and to a lesser extent also B diminishes if the pressure is further increased. Therewith this ratio can be used as a further indication of pressure. For example, in particular in the time-intervals t4−t5 (12−15 s) and t6−t7 (22−25 s) as substantially higher pressure was exerted than in the time intervals t5−t6 (15−22 s) and t7−t8 (22−37 s). As can be seen in FIG. 11, during exertion of the lower pressure, the ratio R/G is about 1.6 and during exertion of the higher pressure, this ratio drops to about 1-3=1.4.

It can further be observed in FIG. 11, that all signals R,G,B show a modulation corresponding to a heartbeat during time-intervals (t3, t4; t5, t6; t7,t8). Also this phenomenon may be detected as an indication of the exerted pressure.

It is noted that the proximity sensor module may also be used as a separate module in other application other than in a display element. For example it may be used in an arrangement that provides audio feedback indicative for the proximity/pressure detection or that provides no feedback other than the effect of the touch input on a controlled device. For example, the proximity sensor module may be used for control of a lighting equipment, and the user observes the changed lighting pattern resulting from the touch input. In an embodiment, the proximity sensor module of FIG. 9A, 9B may be used in combination with other sensors, such as infrared detectors, for example in a manner as described with reference to FIG. 6, 7. Therewith a very high accuracy may be obtained in that the signal processor 7 selects the most reliable sense signal as the output signal or constructs the output signal from the input sense signals by properly weighting the input signals according to their reliability and accuracy. Alternatively, the pressure sensor module of FIG. 9A, 9B may be used autonomously.

Figure 11A:
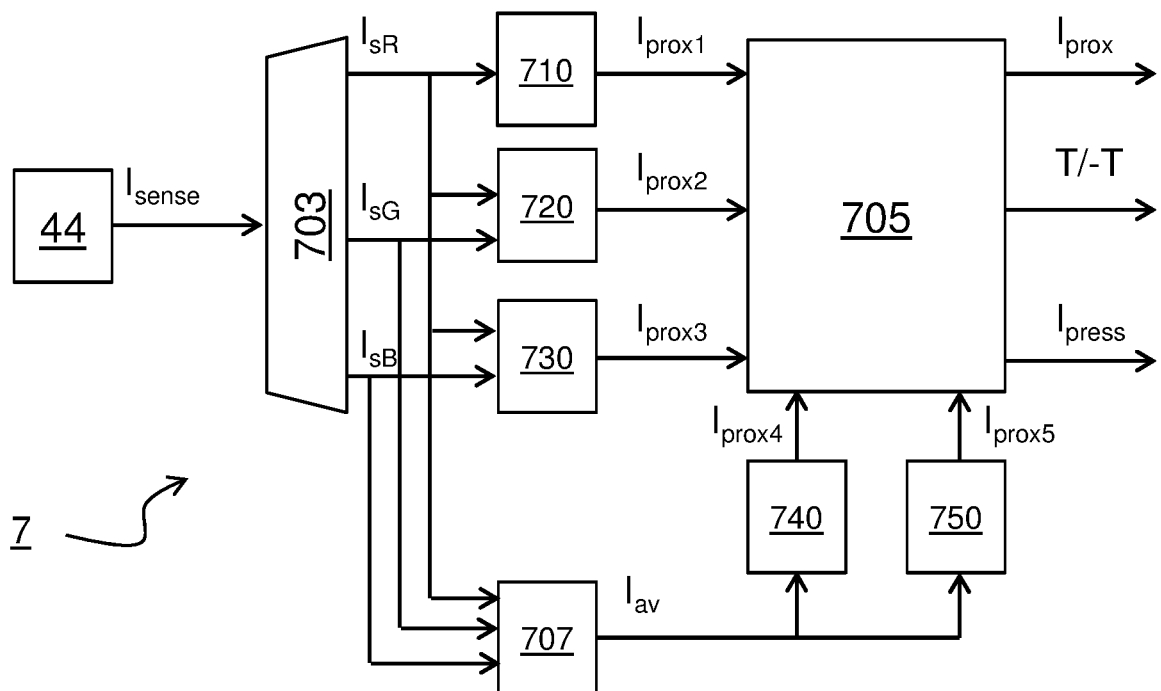
FIG. 11A depicts an exemplary signal processor for processing the sense signals FIG. 12 schematically show a still further embodiment of a proximity sensitive display element.

FIG. 11A shows an exemplary signal processor 7 that may be used for processing the sense signal $I_{sense}$, from the optical radiation sensor 44. In the embodiment shown, the optical radiation sensor 44 is configured to provide the sense signal $I_{sense}$ with at least a first and a second signal component $I_{sR}, I_{sG}, I_{sB}$ indicative for a respective spectral component R,G,B in the received optical radiation. In the embodiment shown in FIG. 11A, the signal processor 7 comprises a de-multiplexing component 703, to isolate the component $I_{sR}, I_{sG}, I_{sB}$ from the sense signal $I_{sense}$. Alternatively, the optical radiation sensor 44. may have separate outputs for providing these components.

The signal processor 7 of FIG. 11A has an output for providing a proximity signal $I_{prox}$ indicative for an extent to which the human finger is in the proximity of the outer surface 161 of the window 16, for example indicating a distance to that surface. The signal processor 7 may further have a separate output for providing a binary signal T/−T to indicate whether or not the outer surface 161 is touched. Still further, the signal processor 7 may have an output to provide a signal $I_{press}$. If the outer surface 161 is touched, this signal is to indicate with which pressure that occurs. Alternatively, the signal $I_{prox}$ may provide all this information. For example the signal $I_{prox}$ may have a polarity indicating whether or not the surface is touched, and for one of the polarities the magnitude of the signal $I_{prox}$ may indicate a distance to the surface and for the other one of the polarities the magnitude of the signal $I_{prox}$ may indicate a pressure exerted on the surface. In the embodiment shown, the signal processor 7 has various proximity estimation components 710, 720, 730, 740, 750, that each generate a proper proximity indication signal $I_{prox1}, I_{prox2}, I_{prox3}, I_{prox4}, I_{prox5}$ based on various signal properties. These proximity indication signals each provide information on one or more of a distance between the finger and a surface and a pressure exerted on the surface.

A first proximity estimation component 710 is to provide an output signal $I_{prox1}$ indicative for an estimation of a proximity (or pressure) as a function of a magnitude indicated by the sense signal. In this case the magnitude of the sense signal used for this purpose is the magnitude of the signal $I_{sR}$ indicative for the red component R. However, alternative one of the other signals $I_{sB}, I_{sG}$ or a combination thereof may be used for this purpose. It has been found that the magnitude is a substantially monotonically decreasing function of the distance in case the surface is not touched, and is a substantially monotonically increasing function of the pressure if the surface is touched.

A second and a third proximity estimation component 720, 730 are to provide an output signal $I_{prox2}, I_{prox3}$ indicative for a proximity as a function of a magnitude of a component $I_{sG}, I_{sB}$ of the sense signal relative to another component $I_{sR}$ of the sense signal. Proximity estimation component 720 generates output signal $I_{prox2}$ as a function of the magnitude ratio indicated by the signal components $I_{sG}, I_{sR}$ and proximity estimation component 720 generates output signal $I_{prox3}$ as a function of the magnitude ratio indicated by the signal components $I_{sB}, I_{sR}$. The signals $I_{prox2}, I_{prox3}$ are particularly indicative for a proximity in terms of a touch pressure, but less indicative for a proximity in terms of a distance.

A fourth proximity estimation component 740 is to provide an output signal $I_{prox4}$ indicative for an estimation for a magnitude of a proximity as a function of a change of a magnitude of the sense signal in time. The magnitude of the sense signal is a mean value indicated by signal Iav, as computed with by mean value computing component 707 from the signals. Alternatively, mean value computing component 707 may use two of the input signal components $I_{sR}, I_{sG}, I_{sB}$, or the fourth proximity estimation component 740 may use one of the input signal components $I_{sR}, I_{sG}, I_{sB}$ as its input. Proximity estimation component 740 estimates the proximity as indicated by its output signal $I_{prox4}$ on the basis of a change in its input signal rather than the absolute value thereof. In this way the indication is independent from certain biases in the sense signal $I_{sense}$, e.g. due to skin color, which may for example be affected by blood pressure and environment temperature.

A fifth proximity estimation component 750 is to provide an output signal $I_{prox5}$ indicative for an estimation for a proximity as indicated by an amplitude of an AC-component in a frequency range of 50-220 Hz. Like component 740, this component 750 also uses the mean value indicated by signal Iav, as computed with by mean value computing component 707 from the signals. Alternatively, mean value computing component 707 may use two of the input signal components $I_{sR}, I_{sG}, I_{sB}$, or the fifth proximity estimation component 750 may use one of the input signal components $I_{sR}, I_{sG}, I_{sB}$ as its input. It has been found that the intensities R,G,B indicated by the signal components $I_{sR}, I_{sG}, I_{sB}$ is modulated at a frequency corresponding to the heartbeat of the user and that the amplitude is strongly related to the pressure exerted on the surface, when the surface is touched by the users finger. In particular it was found that the detected amplitude is a substantially monotonically decreasing function of the exerted pressure. (Substantially) no heartbeat is detectable if the finger does not touch the surface.

As becomes apparent from the above, the various proximity indication signals $I_{prox1}, I_{prox2}, I_{prox3}, I_{prox4}, I_{prox5}$ have mutually different applicability ranges as summarized in the table below.

| Signal | Range |
| --- | --- |
| $I_{prox1}$ | distance and pressure |
| $I_{prox2}$ | Pressure |
| $I_{prox3}$ | Pressure |
| $I_{prox4}$ | Distance and pressure |
| $I_{prox5}$ | pressure |

The signal processor as shown in FIG. 11A further comprises a combination component 705 that computes an output signal $I_{prox}$ indicative for an estimation of the proximity based on output signals $I_{prox1}, I_{prox2}, I_{prox3}, I_{prox4}, I_{prox5}$ from the proximity estimation components 710, 720, 730, 740, 750 as specified above. In the embodiment shown, the signal $I_{prox}$ may indicate a weighted average of the proximity (distance/pressure) as indicated by each of the output signals $I_{prox1}, I_{prox2}, I_{prox3}, I_{prox4}, I_{prox5}$ depending on an estimation of their accuracy. In an embodiment, the weighting may be binary, so that one of the signals $I_{prox1}, I_{prox2}, I_{prox3}, I_{prox4}, I_{prox5}$ is selected as the output signal $I_{prox}$. The combination component may further use one or more (normalized) output signals $S_{70}, S_{71}, S_{72}, S_{73}$ from one or more other sensors 40, 41, 42, 43 as shown in FIG. 6 for example. By way of example, a capacitive sensor 42 may be provided near the window 16 for this purpose, or even within the area defined by the window, provided that translucent materials (e.g. a transparent, electrically conductive oxide, e.g. ITO) are used for the capacitive sensor 42.

Figure 12:
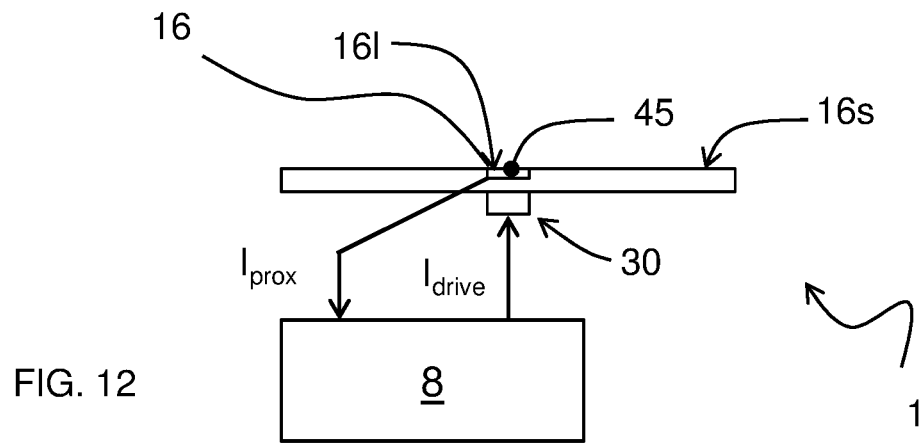
Figure 13:
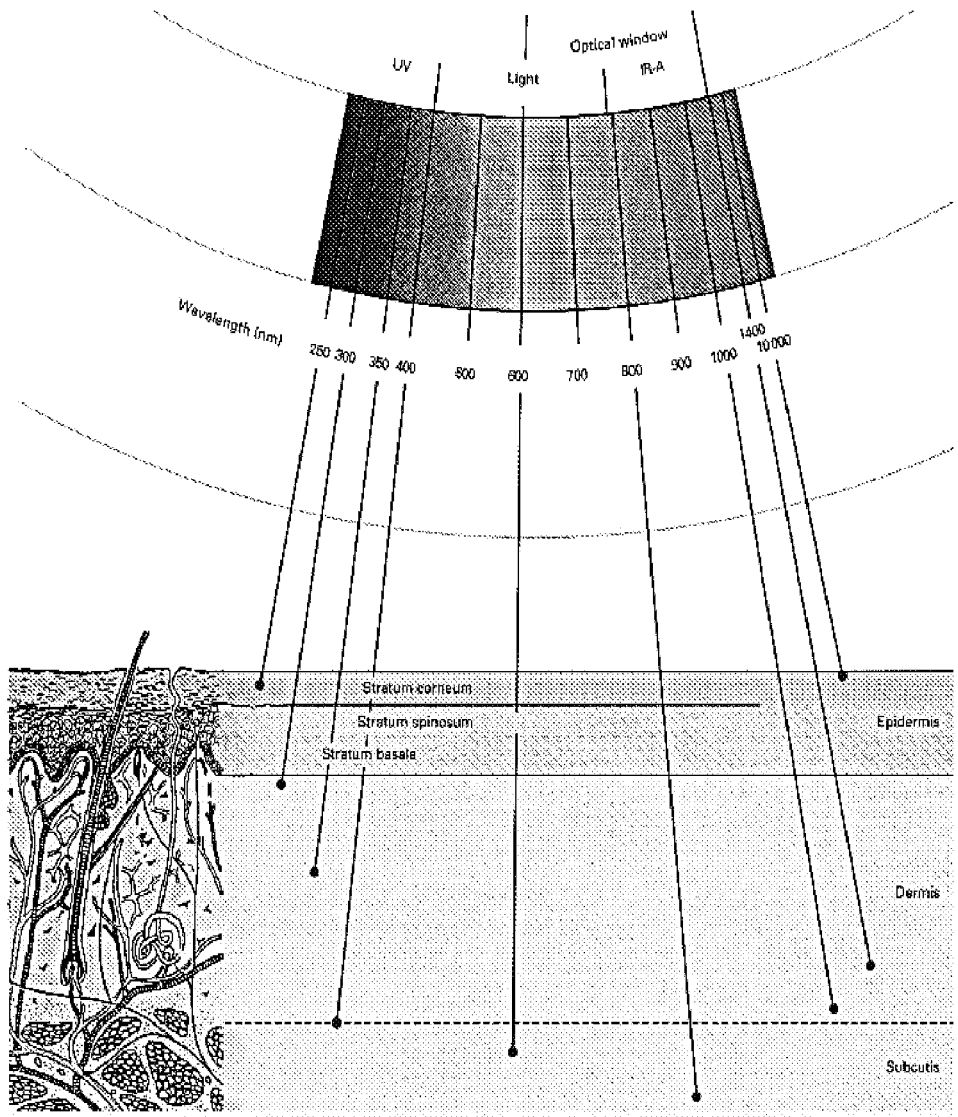
FIG. 13 illustrates optical properties of the human skin.
Figure 14A:
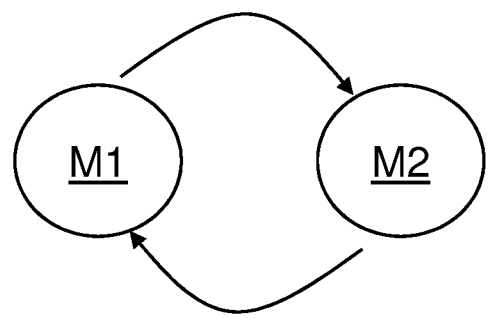
FIG. 14A, 14B illustrate possible operational modes in a method in accordance with said still further embodiment.
Figure 14B:
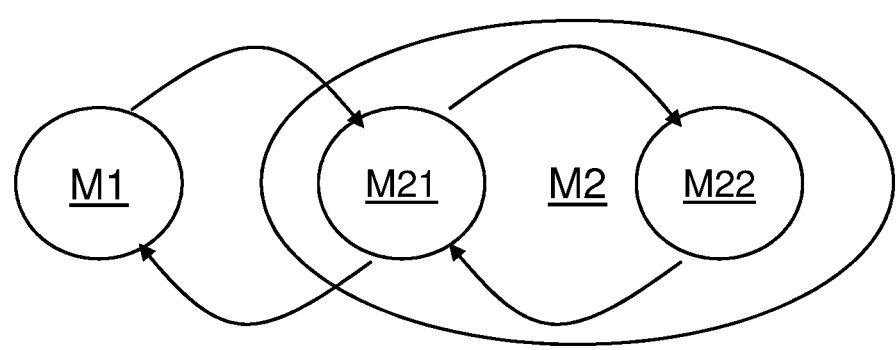

FIG. 12 schematically show a still further embodiment of a proximity sensitive display element. In the embodiment shown therein, a touch sensor 45, for example one of the sensors 40, 41, 42, 43 of FIG. 6 or the sensor of FIG. 9A, 9B or a combination thereof is provided to issue a sense signal Isense indicative for an extent to which the outer surface 161 of the window 16 is touched by a human finger. Additionally a controller 8 is coupled to the touch sensor 45 to receive the sense signal Isense. As shown in FIGS. 14A and 14B, the controller at least has a first and a second potential operational mode M1, M2. The controller 8 is configured to assume the first operational mode M1 if the sense signal indicates that the outer surface is not touched, and is configured to assume the second operational mode M2 if the sense signal is indicative for a detection that the outer surface 161 is touched by the human finger. The controller 8 is coupled to the light emitting element 30 to provide a drive signal Idrive to control the controllable light source dependent on the operational mode, such that in the second operational mode, light irradiated from the controllable light source is perceivable through the human finger. Therewith a visual feedback can be provided at the position where the users finger covers the window. In embodiments, the spectrum of the light emitted by the light emitting element 30 in the second operational mode is dominated by radiation having a wavelength in the range of 650-800 nm, As shown schematically in FIG. 13, the human skin has a relatively high translucency in this spectral range, in particular within 700-780 nm, and the radiation can be well perceived by the user. Therewith a relatively modest intensity can suffice. It is not necessary that optical radiation is visible in the first operational mode M1. Hence, in the first operational mode M1, at least a contribution of a red component in the light irradiated by the light emitting element 30 may be substantially lower than a contribution of a red component in the second operational mode M2. Accordingly the detection of a touch may be made visible, in that the light irradiated from the controllable light source is perceivable through the human finger exclusively in the second operational mode. Alternatively, the controller 8 may be configured to issue the drive signal Idrive such that at least a contribution of the red component in the emitted light is modulated dependent on the operational mode of the controller. The touch sensor 45 may be provided as a pressure sensor, for example as the pressure sensor as described with reference to FIG. 9A, 9B and the controller 8 may be configured to issue the drive signal Idrive in a manner dependent on a pressure as indicated by said pressure sensor. In the embodiment shown in FIG. 14B, this is the case in that the second operational mode M2 of the controller 8 includes at least a first submode M21 to be assumed if the sense signal indicates that an amount of pressure exerted by the human finger on that area is less than a predetermined threshold value and a second sub-mode M22 to be assumed if the sense signal indicates that an amount of pressure exerted by the human finger on that area is at least equal to the predetermined threshold value, wherein the controller is configured to issue the drive signal such that a contribution of the red component in the second sub-mode is higher than in the first sub-mode.

Alternatively, the contribution of the red component may be positively correlated with an amount of pressure exerted by the human finger in that the controller is configured to issue the drive signal Idrive such that a contribution of the red component in the second operational mode M2 is a continuously increasing function of the exerted pressure as indicated by the sense signal Isense.

The controller 8 may be configured to issue the drive signal Idrive such that a contribution of the red component is modulated in accordance with an amount of pressure exerted by the human finger on the area 161.

In embodiments, the controller does not assume the second operational mode until the control area 161 is fully covered with the human finger. Therewith it is avoided that the users eye is partly desensitized due to stray radiation before the area is covered. Therewith the optical radiation transmitted through the human finger can be more easily perceived As an additional measure, the state transition to the second operational mode may for example have a delay of 0.2 to 0.7 s.

In an embodiment the control area 16s is one of a plurality of laterally distributed control areas on the touch surface, and each control area of the plurality of laterally distributed control areas may have a respective pair of a touch sensor and an associated controllable light source.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A proximity sensor module comprising:
 a translucent window having an outer surface;
 a light emitting element at a side of the translucent window opposite the outer surface;
 an optical radiation sensor at a side of the translucent window opposite the outer surface; and
 a signal processor,
 wherein the light emitting element is configured to emit optical radiation to be transmitted through the translucent window towards a human finger at a side of the outer surface of the translucent window,
 wherein the optical radiation sensor is configured to:
  receive a portion of the optical radiation that is reflected by the human finger towards the optical radiation sensor via the translucent window, and
  provide a sense signal representative of the portion of the optical radiation,
 wherein the sense signal comprises:
  a first signal component indicative of a red spectral component of the portion of the optical radiation, and
  a second signal component indicative of a green spectral component of the portion of the optical radiation; and wherein the signal processor is configured to:
  receive the sense signal,
  determine a first value of the first signal component and a second value of the second signal component relative to a respective nominal value;
  compute a ratio between the first value and the second value; and
  provide, based on the ratio, an estimate of a pressure exerted by the human finger on the outer surface.

2. The proximity sensor module according to claim 1, wherein the signal processor has a proximity estimation component that is configured to provide an output signal indicative for an estimation of a proximity as a function of a magnitude indicated by the sense signal.

3. The proximity sensor module according to claim 1, wherein the signal processor has a proximity estimation component that is configured to provide an output signal indicative for an estimation of a proximity as a function of a magnitude of a component of the sense signal relative to another component of the sense signal.

4. The proximity sensor module according to claim 1, wherein the signal processor has a proximity estimation component that is configured to provide an output signal indicative for an estimation of a proximity as a function of a change of a magnitude of (a component of) the sense signal in time.

5. The proximity sensor module according to claim 1, wherein the signal processor has a proximity estimation component that is configured to provide an output signal indicative for an estimation of a proximity as indicated by an amplitude of an AC-component in a frequency range of 50-220 Hz.

6. The proximity sensor module according to claim 1, further being configured to indicate with the proximity signal whether or not the outer surface is touched by the human finger.

7. The proximity sensor according to claim 1, comprising at least a first proximity estimation component and at least a second proximity estimation component,
 wherein the first proximity estimation component and the second proximity estimation component are mutually different and are selected from the group consisting of:
  a proximity estimation component that is configured to provide an output signal indicative for an estimation of a proximity as a function of a magnitude indicated by the sense signal;
  a proximity estimation component that is configured to provide an output signal indicative for an estimation of a proximity as a function of a magnitude of a component of the sense signal relative to another component of the sense signal;
  a proximity estimation component that is configured to provide an output signal indicative for an estimation of a proximity as a function of a change of a magnitude of a component of the sense signal in time; and
  a proximity estimation component that is configured to provide an output signal indicative for an estimation of a proximity as indicated by an amplitude of an AC-component in a frequency range of 50-220 Hz, and
 wherein the proximity sensor further comprises a combination component that is configured to generate an output signal indicative for an estimation of a proximity, based on output signals from the at least a first proximity estimation component and the at least a second proximity estimation component.

8. A proximity sensitive display element including:
a light guide comprising a substrate with a first main side and a second main side mutually opposite to each other and respectively having a first and a second reflective layer with a reflective inner surface facing inside the light guide, a translucent window being defined at the first main side to allow optical radiation to enter and to leave the light guide, the translucent window having an outer surface;
a light emitting element accommodated within the light guide;
a plurality of mutually different proximity sensors comprising at least an infrared (IR) proximity sensor that is arranged at the second main side of the substrate and that faces the first main side through a semi-transparent patch in the second reflective layer; and
at least a further proximity sensor comprising an optical radiation sensor for sensing optical radiation in the visible range that is arranged at a side of the translucent window opposite the outer surface, which optical radiation sensor is configured to:
receive a portion of the optical radiation that is reflected by the human finger towards the optical radiation sensor via the translucent window, and
provide a sense signal representative of the portion of the optical radiation,
wherein the sense signal comprises:
   a first signal component indicative of a red spectral component of the portion of the optical radiation, and
   a second signal component indicative of a green spectral component of the portion of the optical radiation; and
wherein a signal processor is configured to
   receive the sense signal,
   determine a first value of the first signal component and a second value of the second signal component relative to a respective nominal value;
   compute a ratio between the first value and the second value; and
   provide, based on the ratio, an estimate of a pressure exerted by the human finger on the outer surface;
wherein the proximity sensor module further comprises an output unit to generate a resultant proximity signal based on input proximity signals issued by the plurality of mutually different proximity sensors, and
wherein the output unit comprises a selection unit and a controller to cause the selection unit to select an input proximity signal from a specific one of the plurality of proximity sensors if an estimated value for that sensor is within a sensitivity range of that proximity sensor.

9. The proximity sensitive display element according to claim 8, further being configured to indicate with the proximity signal whether or not the outer surface is touched by the human finger.

10. The proximity sensitive display element according to claim 8, wherein the plurality of mutually different proximity sensors further comprises one or more sensors selected from the group comprising a capacitive sensor, a pressure sensor, a near infrared sensor and a middle infrared sensor.

11. The proximity sensitive display element according to claim 8, comprising a sensor array with a plurality of IR-sensors distributed over the second main side facing the first main side through a respective semi-transparent patch, wherein the at least one IR-sensor is one of the IR-sensors.

12. The proximity sensitive display element according to claim 8, wherein the semi-transparent patch is provided as an area wherein the second reflective layer is patterned as a mesh.

13. The proximity sensitive display element according to claim 8, wherein the first reflective layer is arranged between the light guide and an opaque layer.

14. The proximity sensitive display element according to claim 13, wherein the opaque layer has one or more protrusions extending towards the first main side of the light guide.

15. A proximity sensitive display panel assembly comprising a plurality of proximity sensitive display elements according to claim 8.

16. A method of sensing, by using a light emitting element emitting optical radiation and transmitting the optical radiation through a translucent window, proximity to an outer surface of a translucent window, the method comprising:
providing a sense signal which is indicative for a portion of the optical radiation emitted by the light emitting element, and reflected by a human finger through the translucent window;
wherein the sense signal comprises:
   a first signal component indicative of a red spectral component of the portion of the optical radiation, and
   a second signal component indicative of a green spectral component of the portion of the optical radiation; and
wherein the method further comprises:
   determining a first value of the first signal component and a second value of the second signal component relative to a respective nominal value;
   computing a ratio between the first value and the second value; and
   providing, based on the ratio, an estimate of a pressure exerted by the human finger on the outer surface.

* * * * *